Oct. 18, 1960 M. K. MACK ET AL 2,956,913
TRANSISTOR AND METHOD OF MAKING SAME
Filed Nov. 20, 1958 2 Sheets-Sheet 1

INVENTORS
Milton K. Mack and
Elmer A. Wolff, Jr.
BY Stevens, Davis, Miller & Mosher
ATTORNEYS

TRANSISTOR AND METHOD OF MAKING SAME

Filed Nov. 20, 1958 2 Sheets-Sheet 2

INVENTORS
Milton K. Mack and
Elmer A. Wolff, Jr.
BY Stevens, Davis, Miller & Mosher
ATTORNEYS United States Patent Office 2,956,913

Patented Oct. 18, 1960

2,956,913

TRANSISTOR AND METHOD OF MAKING SAME

Milton K. Mack, Garland, and Elmer A. Wolff, Jr., Richardson, Tex., assignors to Texas Instruments Incorporated, Dallas, Tex., a corporation of Delaware Filed Nov. 20, 1958, Ser. No. 775,164

19 Claims. (Cl. 148—1.5)

The present invention relates to a novel transistor device characterized by a uniquely compensated base region and to the method of making the device. More particularly, the present invention relates to a new and useful transistor device of the diffused type characterized by a base region, the portion of which lying adjacent the emitter-base junction is compensated to impart a substantially higher resistivity thereto, and to the method for making this device.

One of the principal problems encountered in diffusion work is the inability to maintain the base resistivity at the emitter junction high enough to give good emitter efficiency and a good emitter-to-base breakdown voltage characteristic. In one type of diffusion process a quantity of impurity material and a semiconductor wafer are sealed in a quartz tube or the like under a vacuum. The tube is then brought to a suitable diffusion temperature, dependent upon the particular wafer and impurity materials, and held at the selected diffusion temperature for a suitable time. As a result, atoms of the impurity material diffuse from the vapor phase at the surface of the solid wafer to a depth primarily dependent upon vapor concentration, temperature and time. Thus, the surface layer of semiconductor material contains diffused impurity atoms. The depth of the diffused layer is normally about 0.1 to 0.2 mil for most useful devices. Since the impurity atoms diffuse into the wafer from the surface toward the interior thereof, there is a concentration gradient of impurity atoms in the diffused layer with the surface of the wafer containing the greatest number of impurity atoms and the leading edge of the diffused layer furthest into the wafer containing the least number of impurity atoms. The concentration between the surface and leading edge will be graded monotonically. Because the surface of the wafer possesses the greatest impurity concentration, it will have a very low resistivity. When a rectifying contact is made to the diffused layer, as for the emitter junction, the characteristics of the junction formed are necessarily defined and limited by the low resistivity of the diffused layer. Such a junction possesses the undesirable properties of too low a breakdown voltage and limited injection efficiency.

Other diffusion processes can be employed to produce essentially the same product. For example, in place of using a sealed tube diffusion as noted above, an open tube system can be employed. In an open tube system, the work (semiconductor wafers) is placed in an open tube or the like and a carrier gas such as nitrogen, hydrogen or other suitable gas containing a quantity of active impurity in the vapor phase is passed over the work under suitably controlled processing conditions such as flow rate, temperature, pressure and others. This type of diffusion process is known in the art to those skilled therein.

It is the principal object of the present invention to provide a novel transistor device and method for manufacture which will not be subject to the limitations described in the foregoing discussion and which will have substantially improved emitter injection efficiency, a remarkably high emitter-to-base breakdown voltage. All these advantages and improvements are brought about through the practice of the concepts of the present invention. The transistor device embodying the concepts of the invention includes a diffused base-collector junction and an alloyed emitter-base junction wherein the semiconductor material of the base region contiguous to the emitter-base junction is compensated to have a substantially higher resistivity than it would otherwise possess as a result of a prior art diffusion technique.

The method of the invention essentially contemplates the formation of the device just described in the preceding paragraph. The practice of the method of the present invention involves forming a diffused layer in a body of semiconductor material in such a manner that the outermost or surface portion of the diffused layer is compensated to have a resistivity appreciably higher than the inner portion of the diffused layer contiguous thereto. An alloy emitter-base junction is formed with the compensated portion. Since the material contiguous to the emitter-base junction on the base side has a relatively high resistivity, the device will have improved emitter injection efficiency, improved transfer efficiency, and a relatively higher emitter-to-base breakdown voltage over what has been accomplished heretofore.

Accordingly, it is another object of the present invention to provide a novel transistor device having a base region, a portion of which is compensated whereby the device will give performance substantially better than comparable units heretofore available.

It is a further object of the present invention to provide a novel method for fabricating a transistor device, as described, which will enable such units to be faithfully reproduced according to specifications with relative simplicity and ease, and with a high percentage yield of useful devices.

Other and further objects of the present invention will become readily apparent from the following detailed description of a preferred embodiment of the present invention when taken in conjunction with the appended drawings in which.

Figure 1:
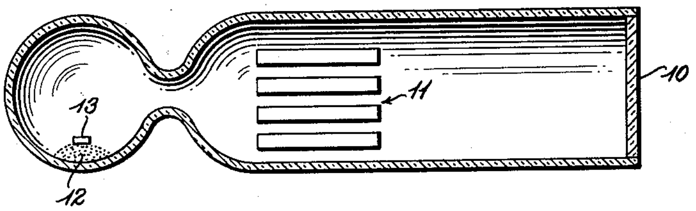
Fig. 1 illustrates schematically the diffusion step in the production of a transistor device of the PNP type embodying the principles of the present invention.

The present invention contemplates the use of any suitable semiconductor material including germanium, silicon, intermetallic alloys and others. In order to simplify the following description of the details of the present invention, the description will be made with reference to germanium as the semiconductor material and with reference to the production of a PNP germanium transistor and an NPN germanium transistor. With this description of the present invention, those skilled in the art will be able, by logical extension or analogy, readily to apply the principles of the invention to all forms of transistor devices and to the use of all semiconductor materials.

Proceeding first with reference to the production of the PNP germanium transistor, attention is directed particularly to Figs. 1 to 4, inclusive.

The first step of the process is to pretreat germanium semiconductor wafers prior to subjecting them to a diffusion operation. The wafers have dimensions in inches approximately 0.50 x 0.50 x 0.010 and exhibit P-type conductivity and have a resistivity of from about 0.01 to about 5 ohm-cm. Consider by way of a specific example that the wafers have a resistivity of 3 ohm-cm. The wafers are immersed in a potassium cyanide solution of approximately 1% concentration for a period of from 1 to 3 hours and at a temperature of from about 75 to about 100° C. The purpose of the pretreatment is to cleanse the wafers as well as possible of all traces of copper. When the wafers are removed from the potassium cyanide solution, they are rinsed in copper-free deionized water to remove all traces of the treating solution. The wafers are then arranged in a suitable stack 11, and are inserted into a quartz tube 10. Also placed in the quartz tube 10 is a quantity of impurity material 12 and a pellet 13. The impurity material 12 is an alloy composed of germanium and an N-type conductivity producing impurity. As a specific example, a suitable alloy consists of germanium and antimony in the ratio of 25 grams of germanium to 10 milligrams of antimony. A quantity of this impurity material is placed into the quartz tube 10, as noted. The exact amount of impurity material used depends, of course, upon the number of wafers that are included in the stack and, also, the vapor concentration desired in the quartz tube 10 during the diffusion process. As a specific example, 60 milligrams of the impurity material are employed. The impurity material is prepared by grinding the alloy to a fineness to pass a 400 mesh sieve.

The pellet 13 may be of any convenient size, for example, it may be approximately 0.05 inch to 0.1 inch in diameter and approximately 0.020 inch to 0.040 inch in thickness. The composition of the pellet is an indium and gallium alloy with the indium serving primarily as a carrier for the gallium. Approximately 0.05 to 0.25 percent by weight gallium is present in the pellet 13 with the remainder being indium.

With the materials placed in quartz tube 10 in general relationship shown in Fig. 1, the quartz tube 10 is evacuated and sealed off. The vacuum drawn is to from about 10 to about 50 microns of mercury. The tube 10 is now placed in a suitable furnace and subjected to a diffusion temperature of from about 650° C. to about 750° C. for a period of from one to twelve hours. As a specific example of the diffusion operation, the wafers may be contained in the quartz tube 10 at a temperature of 700° C. for a period of 4 hours at a vacuum of 30 microns of mercury.

As a result of the diffusion operation described with respect to Fig. 1, impurity atoms, notably atoms of antimony, go into the vapor phase in the quartz tube 10, and subsequently penetrate by diffusion the surfaces of the various solid wafers of stack 11. The depth of penetration of the antimony atoms into the surfaces of the wafers depends primarily upon the vapor concentration of the impurity atoms and the temperature of the diffusion. Suffice it to say that in the practice of the diffusion technique, a diffused layer exhibiting N-type conductivity will be formed on all surfaces of the wafers to a depth of from about 0.1 to about 0.2 mil. Due to the presence of the pellet 13, a number of P-type impurity atoms will be present in the quartz tube 10 and will also diffuse into the surfaces of the various wafers. Because of the difference in the diffusion rates of the two types of impurities, the depth of penetration of the P-type impurity atoms will not match the depth of penetration of the N-type impurity atoms and, consequently, there will be an inner region of the diffused N layer which is substantially free of P-type impurity atoms other than those initially present in the wafer. It will be recalled that the wafers used in the process are of P-type conductivity, and hence contain throughout impurity atoms of a P-type conductivity determining type.

The surface region into which the P-type impurity atoms will penetrate constitutes a compensated N-type conductivity region. The P-type impurity atoms, although they penetrate into the surface of the wafers, will not be of sufficient concentration to reconvert the penetrated regions to P-type conductivity. The impurity atoms of P-type will, however, have the effect of compensating the diffused N-type conductivity regions wherever they penetrate and of substantially increasing the resistivity of the penetrated regions. It has been found empirically and confirmed experimentally that the P-type impurity atoms will penetrate to a depth of from about 200 to 3,000 angstrom units. There will also be formed on the surface of the wafer a low resistivity layer of P-type conductivity. This layer will be very thin and substantially of a monomolecular nature.

At the conclusion of the diffusion operation, the quartz tube 10 and wafers are removed from the furnace and slowly cooled at a rate, for example, of 1 degree centigrade per minute or less for a period of approximately 1½ to 3 hours. Thereafter, the tube and wafers are cooled to room temperature over a further period of from about 4 to about 12 hours. As a specific example of a slow cooling rate, consider 0.5° centigrade per minute.

Figure 2:
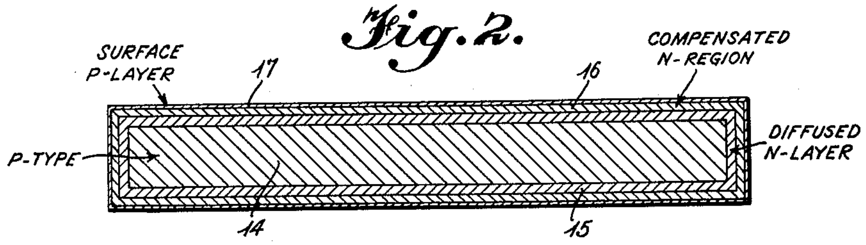
Fig. 2 illustrates in section the product of the diffusion step shown in Fig. 1.

A wafer product of the diffusion process referred to above and illustrated in Fig. 1 is shown in Fig. 2, and consists of the original germanium wafer having a region 14 of the original P-type conductivity. Formed on the perimeter of the region 14 is a diffused layer 15 of N-type conductivity which is from about 0.1 to about 0.2 mil deep. The outer portion or perimeter of the diffused layer 15 is formed as a compensated region 16 of N-type conductivity with high resistivity. As mentioned earlier, the region 16 has a depth of from about 200 to about 3,000 angstrom units. On the immediate surface of the germanium wafer, hardly more than a monomolecular thickness, is a low resistivity layer 17 of P-type conductivity.

The next step of the process is surface treatment of the diffused wafers to remove the surface layer 17. This is accomplished by means of an etching technique which will perform the desired result. For example, the wafers are immersed in concentrated nitric acid for a short period, for instance, approximately 30 seconds. Thereafter, the wafers may be immersed in a very slow acting etchant in order to obtain further surface removal, but at a carefully controlled rate. One material which has been found to be exceptionally useful for this purpose is a composition consisting of a 30% solution hydrogen peroxide and a 1% solution of tartaric acid in the ratio of parts by volume of 1 to 1. The wafers may be immersed into such a composition for a period of from about 5 to about 30 seconds. Whereas a specific preferred composition is described as constituting the slow acting etchant, it will be appreciated that other compositions and materials may be employed for this purpose. The particular composition noted has unique advantages and is preferred. It has been empirically determined and experimentally confirmed that this particular composition will remove approximately 1.1 mils of germanium semiconductor material per 4 hours.

Figure 3:
Fig. 3 illustrates in section the product of Fig. 2 after it has been subjected to a surface treatment.

After surface treatment, the wafers will appear as exemplified in Fig. 3. The central region 14 remains unchanged, as does the diffused layer 15 and the compensated region 16. The molecular layer 17 of P-type conductivity formerly on the surface of the wafer has been removed. The P-N diffused junction formed between the central region 14 and the diffused layer 15 has been designated by the numeral 20.

Figure 4:
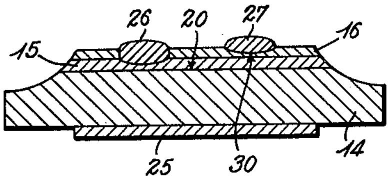
Fig. 4 shows the completed PNP transistor device after fabrication in accordance with the principles of the present invention.

The next step in the process is to prepare the wafers for mounting in headers or supports. The wafers are lapped to remove diffused and compensated regions from all portions of each wafer except one surface, and are etched for cleaning purposes. These operations are carried out in conventional fashion. Contacts are then put on using any suitable technique. There is illustrated in Fig. 4 a typical completed device. A collector contact 25 has been attached to the region 14 of P-type conductivity. A base contact 26 has been alloyed to the diffusion layer 15, and forms an ohmic contact therewith. Since the diffused layer 15 is of N-type conductivity, the base contact 26 preferably contains an N-type conductivity producing impurity. As a specific example of a material which may be used for the base contact 26, consider a gold-antimony alloy containing approximately 0.6% antimony with the remainder being gold. The collector contact 25, as noted, also forms an ohmic contact with the region 14. Since the region 14 is germanium of P-type conductivity, the collector contact is selected from those materials which will form an ohmic connection therewith. Specific examples for the collector contact 25 are an aluminum tab or an indium dot.

An emitter contact 27 has been made to form a rectifying contact with the compensated region 16 of the diffused layer 15. This is accomplished by selecting for the emitter contact a material of opposite conductivity producing type to that predominating in the compensated region 16. For example, aluminum may be utilized for the emitter contact 27 since it will form a rectifying connection with the compensated region 16 of N-type conductivity. The rectifying junction formed between the contact 27 and the compensated region 16 has been designated by the reference numeral 30.

Thus, a PNP-type germanium transistor has been formed containing a diffused junction 20 between the diffused layer 15 and main portion 14 of the germanium wafer and an alloy junction between the emitter contact 27 and the compensated region 16. The various contacts may be placed upon the germanium wafer utilizing any of the known techniques available for this purpose. As a specific example of a technique suitable to be used for this purpose, consider the contracts may be evaporated upon the wafer in a vacuum. In this operation, masking of one type or another is frequently employed to leave free only those areas on the surface of the wafer upon which it is desired to deposit material. Since the masking means, materials and procedures to accomplish the desired ends are well known by those skilled in the art, suffice it to say that any recognized or known technique or procedure may be invoked so long as the result is as noted in Fig. 4 and described with reference to Fig. 4.

The product so illustrated in Fig. 4 is characterized by a high surface sheet resistivity particularly about the base-emitter junction 30. This has the effect of imparting to the device substantially improved emitter injection efficiency and also an improved transfer efficiency. Notably the compensated region 16 has the added advantage of imparting an unusually high emitter-to-base breakdown voltage.

There will now be described, with reference to Figs. 5–10, inclusive, the preparation of an NPN-type germanium transistor device.

In order to prepare NPN devices, germanium wafers characterized by an N-type conductivity and having from about 0.01 to about 5 ohm-centimeters resistivity are pretreated to free them as much as possible from traces of copper. The wafers may be of any size, for example, they may be 0.440 inch square and 0.011 inch thick. The wafers are treated by immersing them in a 1% solution of potassium cyanide for a period of from about 1½ to 3 hours and preferably about 2 hours, at a temperature of from about 75° C. to about 100° C. and, preferably at 95° C. to 100° C. When removed from the potassium cyanide solution, the wafers are washed or rinsed in copper-free deionized water. Thereafter, the wafers are dried and subjected to a diffusion process as illustrated in Fig. 5.

Figures 5, 6, 7, 8, 9, 10:
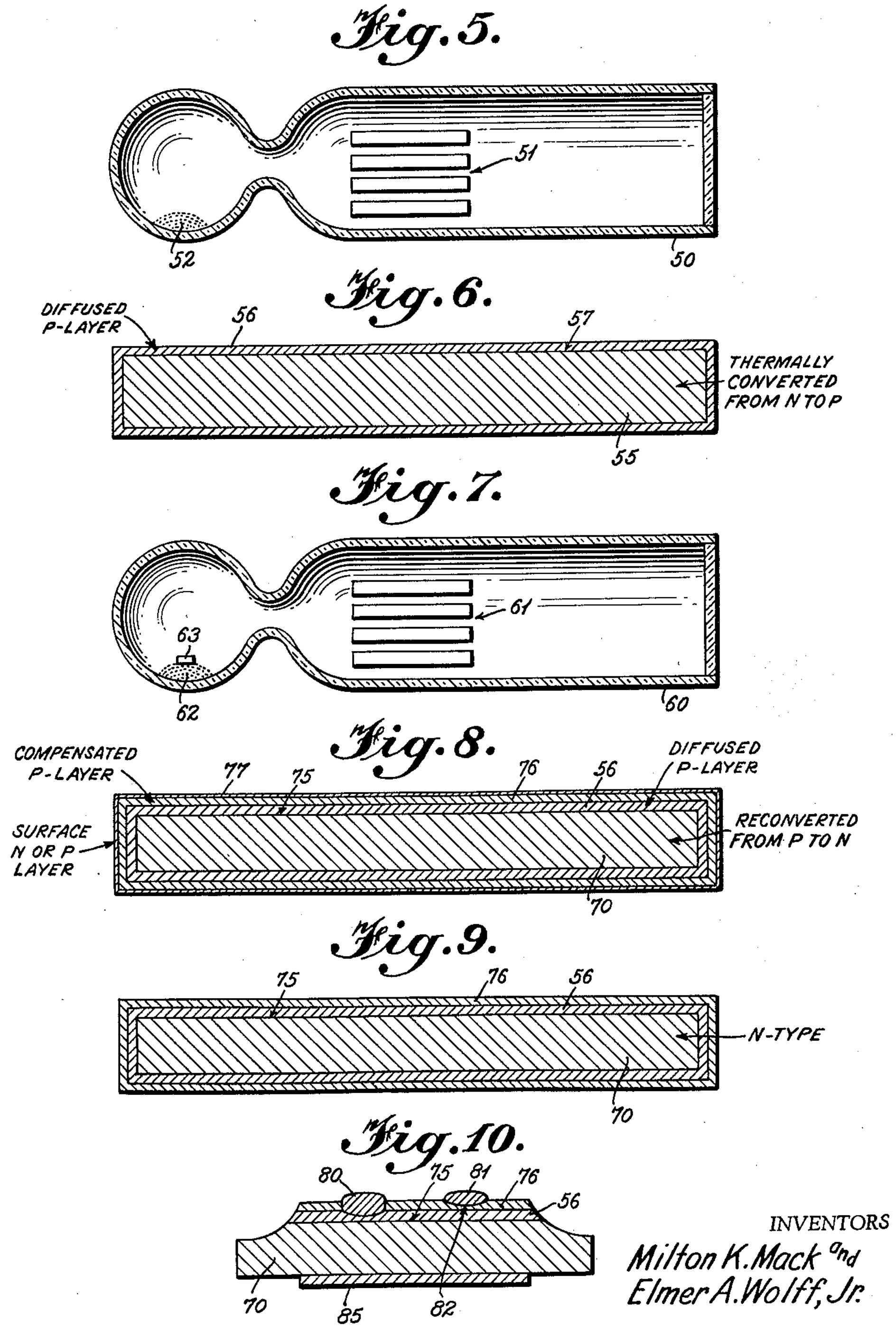
Fig. 5 is a schematic illustration of the first diffusion step in the preparation of a transistor device of the NPN type in accordance with the principles of the present invention.
Fig. 6 illustrates in section the product of the first diffusion step illustrated in Fig. 5.
Fig. 7 illustrates the second diffusion step in the process for preparing the NPN device.
Fig. 8 illustrates in section the product from the second diffusion step shown in Fig. 7.
Fig. 9 illustrates in section the product of Fig. 8 after it has been subjected to a surface treatment.
Fig. 10 illustrates the completed NPN transistor device after fabrication in accordance with the principles of the present invention.

As shown in Fig. 5, a quartz tube 50 contains a stack 51 of wafers in one region thereof and a quantity of ground material 52 in a separate region thereof. The wafers are stacked in a conventional way in order that their surfaces are free to be acted upon by the vapor present in the quartz tube 50. The material 52 constitutes an impurity dope and a suitable quantity of this material is present. The precise amount of this material utilized is not critical, but only determinative of the vapor pressure produced in the quartz tube 50. The impurity material utilized in the diffusion process, as shown in Fig. 5, constitutes an alloy of germanium and indium in the proportion by weight of 24.5 grams of germanium to 0.5 gram of indium. By way of a specific example, consider that 30 milligrams of the impurity material are used. The diffusion operation proceeds at a suitable diffusion temperature for germanium, which will be from about 650° C. to about 900° C., and for a sufficient time to insure a suitable penetration depth of impurity atoms. For example, the diffusion operation will proceed for from one to about 12 hours, and will take place under a vacuum of from about 10 to 50 microns of mercury. In order to have a specific figure for each of the various conditions of the diffusion, consider that the diffusion occurs at a temperature of 750° C. and proceeds for a period of 3½ hours at a vacuum of 28 microns of mercury. As a result of these conditions and the materials employed, indium impurity atoms contained in the vapor phase in the tube 50 will diffuse into the wafers to a depth of from about 0.1 to about 0.2 mil.

During the diffusion process, the germanium semiconductor material will be subjected to a thermal conversion which will convert the wafers from N-type conductivity to P-type conductivity. This thermal conversion is believed to be caused by traces of copper in the semiconductor material of the wafer. Thus, the product of the diffusion, as illustrated in Fig. 6, will consist of a central region 55 originally of N-type conductivity which has been thermally converted to P-type conductivity and a diffused layer 56 of P-type conductivity.

The products of the diffusion of Fig. 5 are then placed into another quartz tube 60, again in the form of a stack 61. Also placed in the quartz tube 60 is an amount of impurity material, depending upon the degree of compensation it is desired to achieve. The impurity material 62 is composed of an alloy of germanium and an impurity material of N-type conductivity producing type, such as arsenic or antimony. As a specific example of the material that may be employed, consider that there is 50 milligrams of material 62 consisting of a germanium-antimony alloy in the ratio by parts by weight of 25 grams of germanium to 10 milligrams of antimony. As noted, other alloys or materials may be employed so long as they constitute an N-type conductivity producing material. Also included in the quartz tube 60 is a pellet 63 approximately .070 inch in diameter and .030 inch thick. The pellet 63 is comprised of an indium and gallium allow with the indium functioning primarily as a carrier for the gallium. Whereas the proportions of the ingredients may vary somewhat, for a clear understanding of the present invention, it will be considered that the pellet is comprised of 99.9% indium and 0.1% gallium by weight.

With the stack 61, pellet 63 and impurity material 62 in the quartz tube 60, it is thereafter evacuated and sealed off and then brought to diffusion temperature. As noted, the diffusion temperature may be from about 650° C. to about 900° C. and the vacuum may be drawn to from about 10 to about 50 microns of mercury. As a specific illustration, consider that the diffusion occurs at a temperature of 700° C. under a vacuum of 20 microns of mercury and proceed for approximately 10 minutes. The time of the diffusion step is variable depending upon the depth of penetration desired, etc., and may be from about 1 to about 60 minutes.

As a result of the diffusion step illustrated in Fig. 7 and described with reference thereto, there is formed the product illustrated in Fig. 8. The product consists of a central region 70, which has now been reconverted from P-type conductivity back to its initial N-type conductivity. This is believed to be brought about by the presence in the quartz tube 60 of the gallium which acts in the manner of a getter to draw copper out of the semiconductor wafer. Surrounding the portion 70 is the diffused layer 56 of P-type conductivity, which was formed as a result of the original diffusion shown in Fig. 5 and described with reference thereto. There will probably be an advance of the barrier 57, which was formed in the diffusion step of Fig. 1. By advance is meant that the P-type impurity atoms which diffuse into the wafer as a result of the first diffusion step will probably advance slightly further into the wafer due to the second diffusion step. In any event, a PN junction 75 will be present between the diffused layer 56 of P-type conductivity and the main region 70, which has been reconverted to N-type conductivity. The outer perimeter of the diffused layer 56 will be a compensated region 76 of high resistivity. The thickness of region 76 will be approximately 200 to 3,000 angstrom units. There is also formed on the surface of the article shown in Fig. 8 a low resistivity surface 77 of N-type or P-type conductivity. This surface 77 is extremely thin, and in all probability, is not substantially thicker than a monomolecular layer. The surface will depend, insofar as its conductivity type is concerned, upon the amount of doping material 62 that was used in the quartz tube 60 and the temperature and time of the diffusion process.

The article or product formed in the diffusion step of Fig. 7 is slowly cooled before it is removed from the quartz tube 60. A desirable rate for slow cooling is 0.4° C. per minute. It is recommended that the slow cooling occur at least over a two-hour period, and that thereafter the rate be increased so that the wafers will cool down to room temperature over a period of from two to twelve additional hours.

After the wafers have been cooled to room temperature, they are then treated to remove the low resistivity surface 77. Any suitable etchant may be employed for this purpose, however, it is generally recommended, based upon past experience, that the etchant used be of a type which acts quite slowly. As an example of a suitable etchant, consider hot hydrogen peroxide 30% concentration or a composition consisting of a 30% solution of hydrogen peroxide and a 1% solution of tartaric acid in a volume ratio of 1:1. As mentioned previously in the description, this composition has the advantage of being a slow-acting etchant functioning to remove approximately 1 mil of germanium material per four hours of treatment at room temperature. By the means described, the low resistivity surface 77 is removed and there remains the structure as illustrated in Fig. 9. It consists, as noted, of the central region 70 of N-type conductivity surrounded by the diffused layer 56 of P-type conductivity with the perimeter region 76 of layer 56 being compensated to impart high resistivity P-type conductivity. A PN junction 75, as noted, is formed between the layer 56 and the central region 70.

Next, the various devices are completed by lapping, etching and attaching contacts. A completed device is shown in Fig. 10, and consists of the main body 70 of N-type conductivity, the diffused layer 56 of P-type conductivity, a PN junction 75 formed between the layer 56 and the region 70, and the perimeter region 76 compensated to impart high resistivity. A base contact 80 is attached to the diffused layer 56 by any convenient means and forms an ohmic connection. For instance, the base contact 80 may be composed of indium, aluminum or any other suitable material or composition which will make an ohmic connection with the diffused layer 56. An emitter contact 81 makes a rectifying connection with the compensated region 76 of high resistivity P-type conductivity. The emitter contact 81 can be composed of any suitable material which will so form the rectifying connection. As examples of suitable materials, consider a gold-antimony alloy containing approximately 0.6% antimony, the remainder being gold, a gold-arsenic alloy containing a minor portion of arsenic and a 3% arsenic-lead alloy. Any of the stated materials can be used as the emitter contact, and will form an alloy PN junction 82 between the emitter contact and the compensated region 76 of layer 56. A collector contact 85 is attached to the opposite face of the wafer to the region 70. Since the region 70 which constitutes the collector region of the transistor device is characterized by N-type conductivity, the collector contact is preferably attached to form an ohmic connection. Suitable materials which may be employed for this purpose are gold-antimony alloy, gold-arsenic alloy, arsenic-lead alloy and others.

The various contacts are placed on the transistor device by any suitable means. One convenient way that this may be accomplished is to evaporate the contacts onto the wafer. Since the techniques for accomplishing this are well known in the art and the apparatus, temperatures, pressures, etc. are also well known, suffice it to say that any conventional technique may be employed to attach the various contacts. It is only necessary that the base contact make an ohmic connection with the diffused layer 56, the collector contact make an ohmic connection with the region 70, and the emitter contact 82 make a rectifying contact with the compensated region 76 of layer 56.

As a result of the process described in conjunction with Figs. 5–10, inclusive, a product is produced having an exceptionally high sheet resistivity in the region 76. The result of this is to produce contiguous to the junction 82 a region of high resistivity. This, in turn, produces substantially improved emitter injection efficiency, improved transfer efficiency, and a relatively high emitter-to-base breakdown voltage.

Since the invention has been shown and described with references to two specific embodiments, it will be evident that many variations are possible. For example, although the invention has been described with specific reference to germanium as the semiconductor material, other semiconductor materials may be employed. Thus, silicon and intermetallic alloys are not to be precluded. If silicon is employed, certain technological changes will be required due to the differeneces in the physical properties of the materials. The formation of the compensated region of the diffused base layer can be accomplished with silicon by using the techniques described above with respect to germanium, and applying them by logical extension or analogy to silicon, bearing in mind the technological differences in processing, as well as the differences in the properties of the two materials. However, it will be apparent to one skilled in the art how the ends of the invention can easily be achieved with regard to silicon from the teachings above with regard to germanium. The same is true with regard to intermetallic alloys and other forms of semiconductor materials.

It is also noted that the diffusion processes described in the preceding have been with reference to closed tube-vacuum systems. It will be appreciated that use of other diffusion processes to produce the results described is well within the purview of the invention. Thus, open tube type systems can be used if desired. In an open tube system, the work (semiconductor wafers) is placed in an open tube or the like and a carrier gas (nitrogen, hydrogen, inert gas or other) containing a quantity of an active impurity in the vapor phase is passed over the work under suitable processing conditions as regards flow rate, temperature, pressures and others. These types of diffusion processes are well known to those skilled in this art.

Although the invention has been described in terms of specific embodiments, it will be appreciated that such changes and modifications as do not depart from the spirit, scope and contemplation of the invention, and which are obvious to one skilled in this field, are deemed to come within the scope of the inventive concepts shown and described herein.

What is claimed is:

1. A transistor device comprising a body of semiconductor material containing impurity atoms of one conductivity-producing type, impurity atoms of opposite conductivity-producing type diffused into a region of said body, impurity atoms of said one conductivity-producing type diffused into a portion of said region to compensate same, and means including impurity atoms of said one conductivity-producing type alloyed to said compensated portion.

2. A transistor device as defined in claim 1, wherein said impurity atoms of one conductivity-producing type are impurity atoms of the N conductivity-producing type.

3. A transistor device as defined in claim 1, wherein said impurity atoms of one conductivity-producing type are impurity atoms of the P conductivity-producing type.

4. A transistor device as defined in claim 1, wherein said means constitutes a contact.

5. A transistor device as defined in claim 1, wherein said means functions as the emitter, said region functions as the base, and the remainder of said body functions as the collector.

6. A transistor device as defined in claim 1, wherein said semiconductor material is selected from the group consisting of germanium, silicon, intermetallic alloys, and combinations thereof.

7. A transistor device as defined in claim 1, wherein said semiconductor material is germanium.

8. A transistor device as defined in claim 1, wherein said semiconductor material is silicon.

9. A transistor device as defined in claim 1, wherein said semiconductor material is an intermetallic alloy.

10. A transistor device comprising a body of semiconductor material containing impurity atoms of one conductivity-producing type, impurity atoms of opposite conductivity-producing type diffused into a region of said body, impurity atoms of said one conductivity-producing type diffused into a portion of said region to compensate same, contact means including impurity atoms of said one conductivity-producing type alloyed to said compensated portion, and contact means attached to said region and to said body.

11. A transistor device comprising a body of semi-conductor material containing impurity atoms of one conductivity-producing type, impurity atoms of opposite conductivity-producing type diffused into a region of said body, impurity atoms of said one conductivity-producing type diffused into a portion of said region to compensate same, contact means including impurity atoms of said one conductivity-producing type alloyed to said compensated portion, contact means including impurity atoms of said opposite conductivity-producing type alloyed to said region, and contact means including impurity atoms of said one conductivity-producing type alloyed to said body.

12. A transistor device comprising a body of semi-conductor material composed of a collector region containing impurity atoms of one conductivity-producing type, a base layer contiguous to said collector region defined by impurity atoms of opposite conductivity-producing type diffused into said body to form a diffused PN junction separating said collector region and said base layer, impurity atoms of said one conductivity-producing type diffused into a portion of said base layer to compensate same, and an emitter region including impurity atoms of said one conductivity-producing type contiguous to the compensated portion of said base layer and forming therewith an alloy PN junction.

13. A method of making a transistor device comprising the steps of diffusing impurity atoms of one conductivity-producing type into a region of a body of semi-conductor material containing impurity atoms of opposite conductivity-producing type, diffusing impurity atoms of said opposite conductivity-producing type into a portion of said region to compensate same, and alloying a material containing impurity atoms of said opposite conductivity-producing type with said compensated portion.

14. A method as defined in claim 13, wherein said impurity atoms of one conductivity-producing type are N-type conductivity-producing atoms.

15. A method as defined in claim 13, wherein said impurity atoms of one conductivity-producing type are P-type conductivity-producing atoms.

16. A method as defined in claim 13, wherein said semiconductor material is selected from the group consisting of germanium, silicon, intermetallic alloys, and combinations thereof.

17. A method of making a transistor device comprising the steps of diffusing impurity atoms of one conductivity-producing type into a region of a body of semiconductor material containing impurity atoms of opposite conductivity-producing type to form a diffused base layer and a diffused PN junction, diffusing impurity atoms of said opposite conductivity-producing type into said base layer to compensate same, and alloying a material containing impurity atoms of said opposite conductivity-producing type with a compensated portion of said base layer to form an alloy PN junction.

18. A method of making a transistor device comprising the steps of diffusing impurity atoms of one conductivity-producing type into a region of a body of semi-conductor material containing impurity atoms of opposite conductivity-producing type, diffusing impurity atoms of said opposite conductivity-producing type into a portion of said region to compensate same, alloying a material containing impurity atoms of said opposite conductivity-producing type with said compensated portion, and alloying material containing active impurity atoms to said region and said body.

19. A method of making a transistor device comprising the steps of diffusing impurity atoms of one conductivity-producing type into a region of a body of semiconductor material containing impurity atoms of opposite conductivity-producing type, diffusing impurity atoms of said opposite conductivity-producing type into a portion of said region to compensate same, alloying a material containing impurity atoms of said opposite conductivity-producing type with said compensated portion and with said body, and alloying a material containing impurity atoms of said one conductivity-producing type with said region.

References Cited in the file of this patent

UNITED STATES PATENTS

| | | |
|---|---|---|
| 2,843,511 | Pankove | July 15, 1958 |
| 2,861,018 | Fuller et al. | Nov. 18, 1958 |